United States Patent
Yamamoto et al.

(10) Patent No.: US 7,564,164 B2
(45) Date of Patent: Jul. 21, 2009

(54) DRIVE CIRCUIT FOR PIEZOELECTRIC PUMP AND COOLING SYSTEM THAT USES THIS DRIVE CIRCUIT

(75) Inventors: Mitsuru Yamamoto, Minato-ku (JP); Sunao Hamamura, Minato-ku (JP); Yasuhiro Sasaki, Minato-ku (JP); Sakae Kitajo, Minato-ku (JP)

(73) Assignee: NEC Corporation, Tokyo (JP)

( * ) Notice: Subject to any disclaimer, the term of this patent is extended or adjusted under 35 U.S.C. 154(b) by 87 days.

(21) Appl. No.: 10/590,081

(22) PCT Filed: Feb. 1, 2005

(86) PCT No.: PCT/JP2005/001389

§ 371 (c)(1),
(2), (4) Date: Aug. 21, 2006

(87) PCT Pub. No.: WO2005/080793

PCT Pub. Date: Sep. 1, 2005

(65) Prior Publication Data

US 2007/0242427 A1    Oct. 18, 2007

(30) Foreign Application Priority Data

Feb. 23, 2004    (JP)    ............... 2004-046168

(51) Int. Cl.
    *H01L 41/09*    (2006.01)
(52) U.S. Cl. .................................................. 310/317
(58) Field of Classification Search ............. 310/317
    See application file for complete search history.

(56) References Cited

U.S. PATENT DOCUMENTS

| | | | |
|---|---|---|---|
| 2002/0008439 A1* | 1/2002 | Senda et al. | 310/316.02 |
| 2002/0033322 A1* | 3/2002 | Nakano et al. | 200/237 |
| 2006/0132231 A1* | 6/2006 | Ishii et al. | 330/10 |

FOREIGN PATENT DOCUMENTS

| JP | 62-189816 | 12/1987 |
|---|---|---|
| JP | 1-93379 U | 6/1989 |

(Continued)

OTHER PUBLICATIONS

Honda et al., "Class D Audio Amplifier Design", International Rectifer, Oct. 8, 2003.*

*Primary Examiner*—Quyen P Leung
*Assistant Examiner*—Derek J Rosenau
(74) *Attorney, Agent, or Firm*—Sughrue Mion, PLLC (57) ABSTRACT

A piezoelectric element of the piezoelectric pump is driven by the output signal of an amplifier that takes as input a signal that is generated by a sine wave oscillator of the same frequency that drives the piezoelectric element. The amplifier is driven by a high voltage obtained by conversion from a low-voltage power supply by a voltage-boosting converter, whereby the piezoelectric element is driven by a low-frequency sine wave of high voltage. The frequency of the sine wave oscillation is further adjusted by a signal from a first control circuit at the time of activation. In addition, the amplitude of the sine wave oscillation is adjusted by the output signal of a second control circuit that takes as input a signal from temperature sensor for sensing the temperature of the heat-generating body.

17 Claims, 9 Drawing Sheets

FOREIGN PATENT DOCUMENTS

| | | |
|---|---|---|
| JP | 04-183978 A | 6/1992 |
| JP | 09-324764 A | 12/1997 |
| JP | 11-136931 A | 5/1999 |
| JP | 2001-355574 A | 12/2001 |
| JP | 2002-163042 A | 6/2002 |
| JP | 2002-339872 A | 11/2002 |
| JP | 2003-029879 A | 1/2003 |
| JP | 2003-120541 A | 4/2003 |
| JP | 2003-121254 A | 4/2003 |
| JP | 2003-130646 A | 5/2003 |

* cited by examiner

DRIVE CIRCUIT FOR PIEZOELECTRIC PUMP AND COOLING SYSTEM THAT USES THIS DRIVE CIRCUIT

This application claims priority from PCT Application No. PCT/JP2005/001389 filed Feb. 1, 2005, and from Japanese Patent Application No. 2004-046168 filed Feb. 23, 2004, which applications are incorporated herein by reference.

BACKGROUND

The present invention relates to a drive circuit for a piezoelectric pump used in a cooling device for cooling a heat-generating body of an electronic component, and to a cooling system that uses this drive circuit.

Processors for high-speed processing are used in, for example, notebook computers, and cooling devices are required for reducing the rise in temperature caused by the heat generated by this equipment. One such cooling method of this type in the prior art is the water-cooled method that employs a piezoelectric pump as described in JP-A-2001-355574.

When using a piezoelectric pump, an alternating current at a voltage of approximately 100V is required as the drive voltage to produce a large displacement when deforming the piezoelectric material that is used in the piezoelectric pump. In addition, the drive frequency is a low frequency of several tens to several hundred Hz due to the response of valves that operate in accordance with the displacement of the piezoelectric pump.

The power supply in electronic equipment that uses a cooling device that employs a piezoelectric pump has a low voltage such as +5V, and an inverter circuit is therefore necessary as the piezoelectric element drive circuit of the piezoelectric pump to produce power having low-frequency at a high voltage from the low-voltage power supply.

Figure 1:
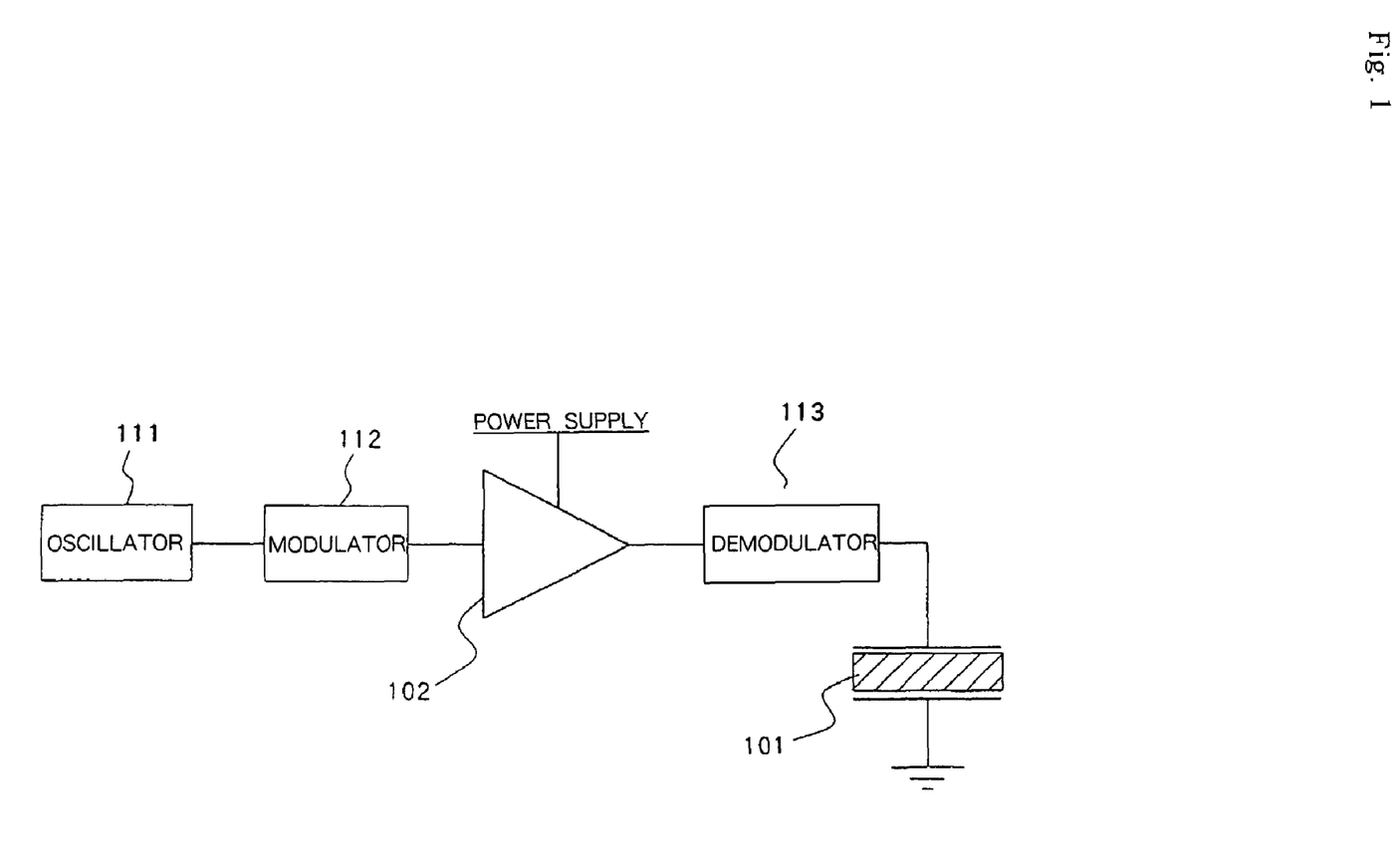
FIG. 1 is a block diagram showing the configuration of an example of the prior art.
Figure 2:
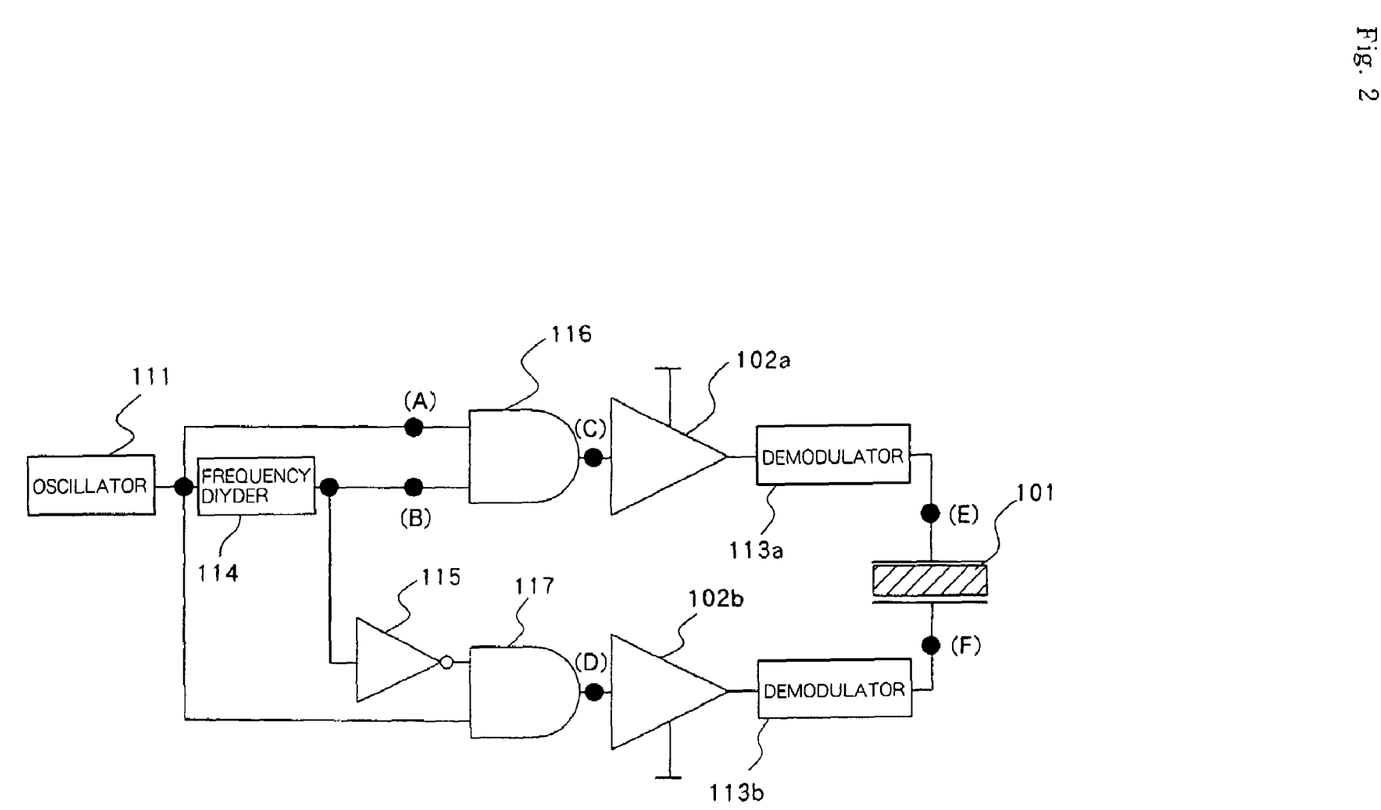
FIG. 2 is a block diagram showing the configuration of an example of the prior art.
Figure 3:
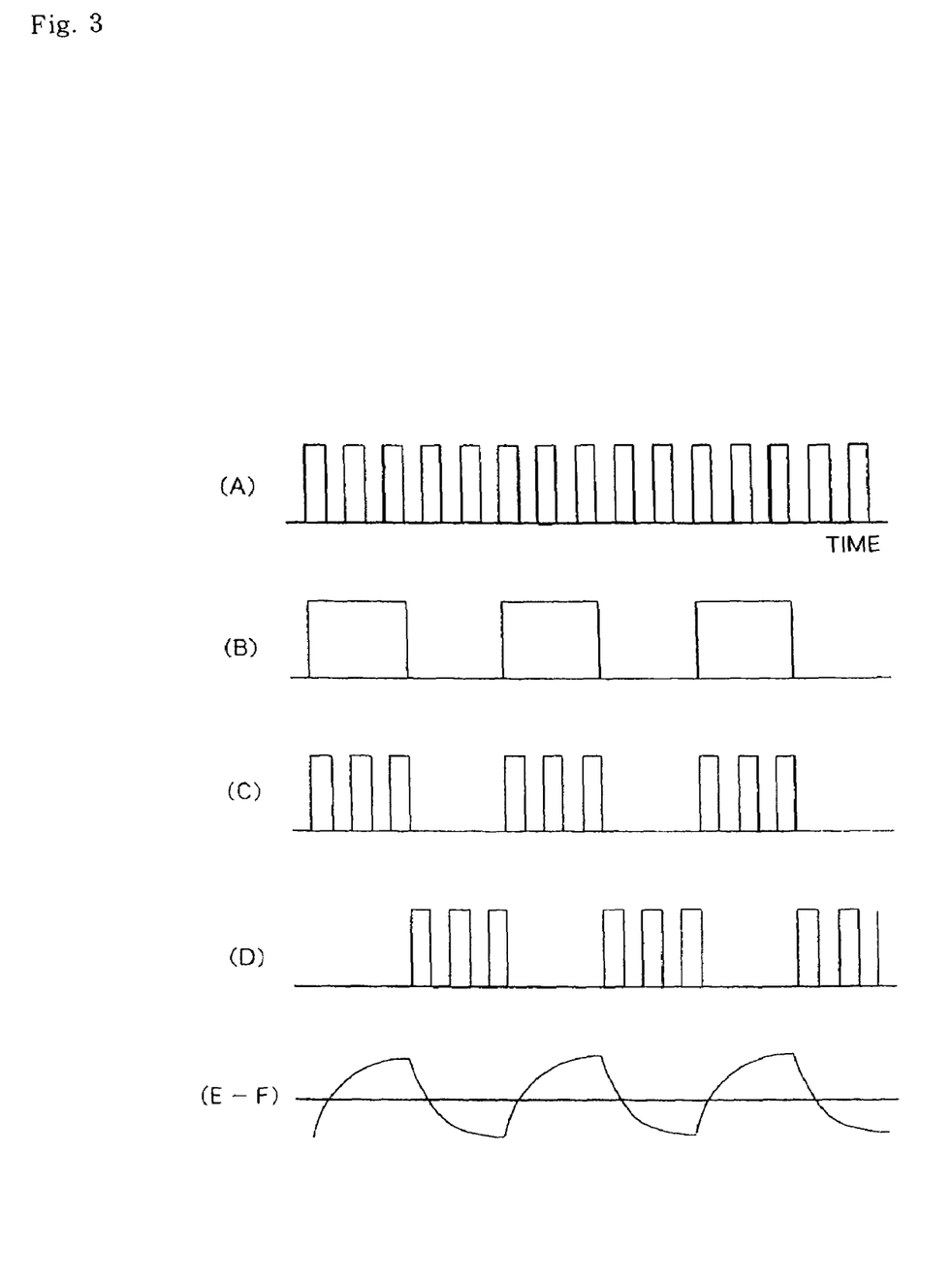
FIG. 3 is a waveform chart for showing the operation of an example of the prior art.

Normally, a low-frequency transformer is used as the above-described inverter circuit, but the use of a low-frequency transformer increases the size of the device and necessitates large packaging space and thus raises problems when used in mobile equipment that requires a compact and thin form. As a solution to this problem, JP-A-2002-339872 discloses a drive method for driving a piezoelectric pump. FIG. 1 is a schematic block diagram showing the configuration of the circuit provided in JP-A-2002-339872, FIG. 2 is a block diagram showing the configuration of this circuit in greater detail, and FIG. 3 is a waveform chart of each part showing the operation of this circuit.

Explanation next regards the circuit that is proposed in JP-A-2002-339872 with reference to FIG. 1. In FIG. 1, oscillator 111 generates a first clock signal and a second clock signal having prescribed frequencies. The first clock signal is a signal of a frequency that matches the drive frequency of piezoelectric element 101 that drives the piezoelectric pump, and the second clock signal is a carrier signal of higher frequency than the first clock signal that is set by taking into consideration the amplification efficiency of amplifier 102. In this circuit, the frequency of the first clock signal is set to 50 Hz, and the frequency of the second clock signal is set to 14 kHz.

Modulator 112 uses the first clock signal that matches the drive signal of piezoelectric element 101 to perform AM modulation of the carrier wave that is constituted by the second clock signal to produce a modulated wave signal. This modulated wave signal is applied as input to amplifier 102 to realize signal amplification. The modulated wave signal following amplification is applied as input to demodulator 113 whereby a modulated signal (the pump drive signal) of the same frequency as the first-clock signal that has been amplified is extracted and applied to the electrodes of piezoelectric element 101.

According to the above-described configuration, amplifier 102 amplifies the second clock signal, which is of a higher frequency than the first clock signal. In other words, the second clock signal is amplified and a modulation process implemented to produce a desired drive signal without directly amplifying the first clock signal, and because the low-frequency signal is not directly amplified, the problems of increased complexity, size, and cost of amplifier 102 can be avoided. In particular, JP-A-339872 shows that a more compact and lighter component can be realized by using a high-frequency transformer as an amplification circuit.

Explanation next regards the details of the operation of this device with reference to FIGS. 2 and 3.

In FIG. 2, 114 is a frequency divider, 115 is a NOT circuit, 116 is the first AND circuit, 117 is the second AND circuit, 102a is the first amplifier, 102b is the second amplifier, 113a is the first demodulator, and 113b is the second demodulator.

Oscillator 111 generates a second clock signal of 14 kHz. This second clock signal is branched and applied as input to each of frequency divider 114, first AND circuit 116, and second AND circuit 117. The signal that is applied as input to frequency divider 114 is frequency-divided to the drive frequency of piezoelectric element 101 to produce a first clock signal of 55 Hz. This first clock signal is branched, one portion being directly applied as input to first AND circuit 116 and the other portion being applied as input to second AND circuit 117 by way of NOT circuit 115. These AND circuits 116 and 117 implement AM modulation. The two modulated wave signals are respectively applied as input to first amplifier 102a and second amplifier 102b to undergo amplification and then drive piezoelectric element 101 by way of first demodulator 113 and second demodulator 113b, respectively.

FIG. 3 shows the signal waveforms at points A, B, C, and D in FIG. 2 and the signal waveform that is applied to the piezoelectric element. The signal at point A is the second clock signal, which is the signal generated at oscillator 111 as shown in FIG. 3(A), and is the carrier wave in the modulation process. The signal at point B is the first clock signal obtained by the process of frequency-dividing the second clock signal and is a signal of the same frequency as the pump drive frequency. This signal is the drive signal that precedes modulation in the modulation process. In addition, a signal of the opposite phase of the second clock signal is applied as input to second AND circuit 117. The signal at point C is the modulated wave obtained by modulating the first clock signal with the second clock signal as the carrier wave as shown in FIG. 3(C). The signal at point D is the modulated wave obtained by modulating a signal of opposite phase of the first clock signal with the second clock signal as the carrier wave, as shown in FIG. 3(D).

The differential of the signal at point E, which is a signal obtained by demodulating the modulated wave by first demodulator 113a, and the signal at point F, which is a signal obtained by demodulating the modulated wave by second demodulator 113b, is applied as input to piezoelectric element 101, whereby piezoelectric element 101 is driven.

The first problem to be solved by the present invention is the generation of large vibrational noise from the piezoelectric pump and the consequent inability for application to devices that are used in environments in which quiet operation is desired. Although the drive waveform of a piezoelectric pump is a frequency that is lower than audible frequencies, this vibrational noise occurs both because, the drive waveform includes a harmonic frequency component within the audible frequency band, and because the drive waveform is not a sine wave. Undesired noise is produced by the vibration of the harmonic component.

The second problem is the inability to start the circulation of liquid due to inadequate pressure from the piezoelectric pump at the time of activating the power supply. This problem occurs because temperature changes in the electronic equipment or pressure changes in the liquid passages cause cohesion of, for example, oxygen that is contained in the liquid and the consequent occurrence of bubbles in the liquid passages of the coolant. These bubbles remain in the pump chamber of the piezoelectric pump and thus absorb pressure and reduce pressure that is transmitted from the pump to the liquid.

The third problem is the pointless consumption of power that results from the operation of the piezoelectric pump and the drive circuit even when heat is not being generated by the heat-generating body, i.e., the electronic component that is to be cooled.

SUMMARY

The present invention was realized in view of the above-described problems of the prior art and has as an object the provision of a piezoelectric pump drive method that allows a reduction in size and weight.

It is another object of the present invention to provide a drive circuit of a piezoelectric pump that can reduce noise.

It is yet another object of the present invention to provide a drive circuit of a piezoelectric pump that can reliably start operation upon activation of the power supply and thus achieve an improvement in reliability.

It is yet another object of the present invention to provide a drive circuit of a piezoelectric pump that can realize lower power consumption.

The drive circuit for a piezoelectric pump of the present invention includes:

sine wave oscillation means for generating a sine wave signal of the frequency that drives a piezoelectric element of a piezoelectric pump; a voltage-boosting means for converting a low-voltage power supply to a high voltage;

an amplification means driven by the high voltage generated by the voltage boosting means for amplifying the signal supplied from the sine wave oscillation means and for driving the piezoelectric element by a high-voltage sine wave.

In this case, the amplification means may be made up from: a D-class amplifier that is driven at the high voltage generated by the voltage-boosting means and that subjects the signal supplied from the sine wave oscillation means to pulse-width modulation to realize amplification, and a low-pass filter for demodulating the output signal of the D-class amplifier.

A first control means may be further included for implementing variable frequency control at the time of activating the sine wave oscillation means.

The drive circuit may further include: a temperature sensing means for sensing temperature; and a second control means for adjusting the signal amplitude of the sine wave oscillation means according to the sensed temperature of the temperature sensing means.

The cooling system according to the present invention includes:

a piezoelectric pump drive circuit according to any one of the above-described drive circuits;

a heat sink that contacts the heat-generating body;

a radiator for radiating heat to the outside;

coolant circulation passages that are connected such that coolant circulates between the heat sink and the radiator; and a piezoelectric pump that is driven by the piezoelectric pump drive circuit for circulating coolant inside the coolant circulation passages.

In the present invention that is configured as described above, the objects of the present invention are achieved by driving the piezoelectric element of the piezoelectric pump by a sine wave, by adjusting the drive frequency at the time of activation, and by adjusting the output voltage of a voltage-boosting converter and the amplitude of a sine wave oscillator when cooling is unnecessary.

In the present invention, the piezoelectric element of the piezoelectric pump takes as input the sine wave signal from the sine wave oscillation means and is driven by a sine wave that is amplified by the amplification means, whereby undesirable noise is not generated. In addition, the direct amplification of the sine wave that is generated by the sine wave oscillation means allows the piezoelectric element to be driven directly without need for a special filter for demodulation on the output side of the amplification means, whereby the number of components can be reduced and a more compact configuration realized.

In addition, the power supply of the amplification means drives the amplification means at a voltage obtained by using the voltage-boosting means to convert from the low-voltage power supply to a high voltage, whereby the piezoelectric element of the piezoelectric pump can be driven by a high voltage that is produced from the low-voltage power supply in the electronic device to enable an increase in the amount of displacement of the piezoelectric element and an increase in the flow rate of the pump.

The sine wave oscillation means, in accordance with signals from a first control means for controlling frequency at the time of activation of the power supply, sweeps frequencies to expel any bubbles from the pump chamber that remain in the pump chamber of the piezoelectric pump, whereby circulation of the liquid can be started smoothly.

The output voltage of the voltage-boosting means is adjusted by the second control means in accordance with the temperature level of the electronic component to be cooled that is sensed by the temperature sensing means, whereby unnecessary consumption of power can be reduced.

Finally, the amplification means is composed of a D-class amplifier and a low-pass filter for demodulating the signal after amplification, whereby the amplification means can be driven by a sine wave with low power loss.

As the first effect of the present invention, the drive waveform of the piezoelectric pump is a sine wave, whereby the piezoelectric pump can realize quiet operation as a cooling device without generating undesirable vibrational noise from the piezoelectric pump.

As the second effect, even when bubbles are present in the pump chamber of the pump, these bubbles are expelled at the time of activation, whereby the inability to begin circulation of liquid due to inadequate pressure can be solved and reliable operation realized.

As the third effect, when the heat-generating body is not discharging heat, the drive voltage of the piezoelectric element of the piezoelectric pump can be decreased to thus reduce pointless power consumption by the drive circuit and suppress the generation of heat.

DETAILED DESCRIPTION OF THE INVENTION

Explanation next regards the details of embodiments of the present invention with reference to the accompanying figures.

Figure 4:
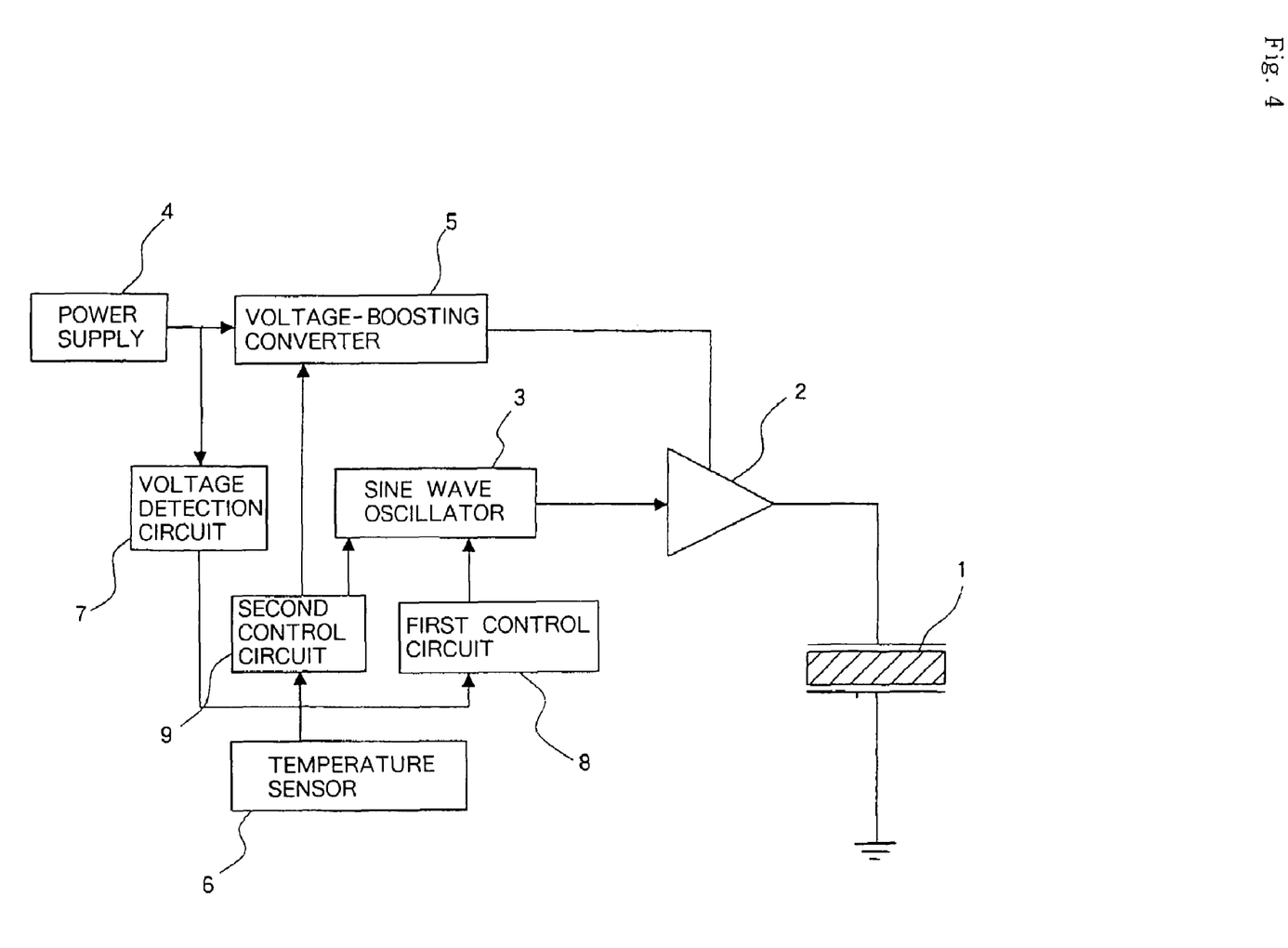
FIG. 4 is a block diagram showing the configuration of an embodiment of the present invention.
Figure 5:
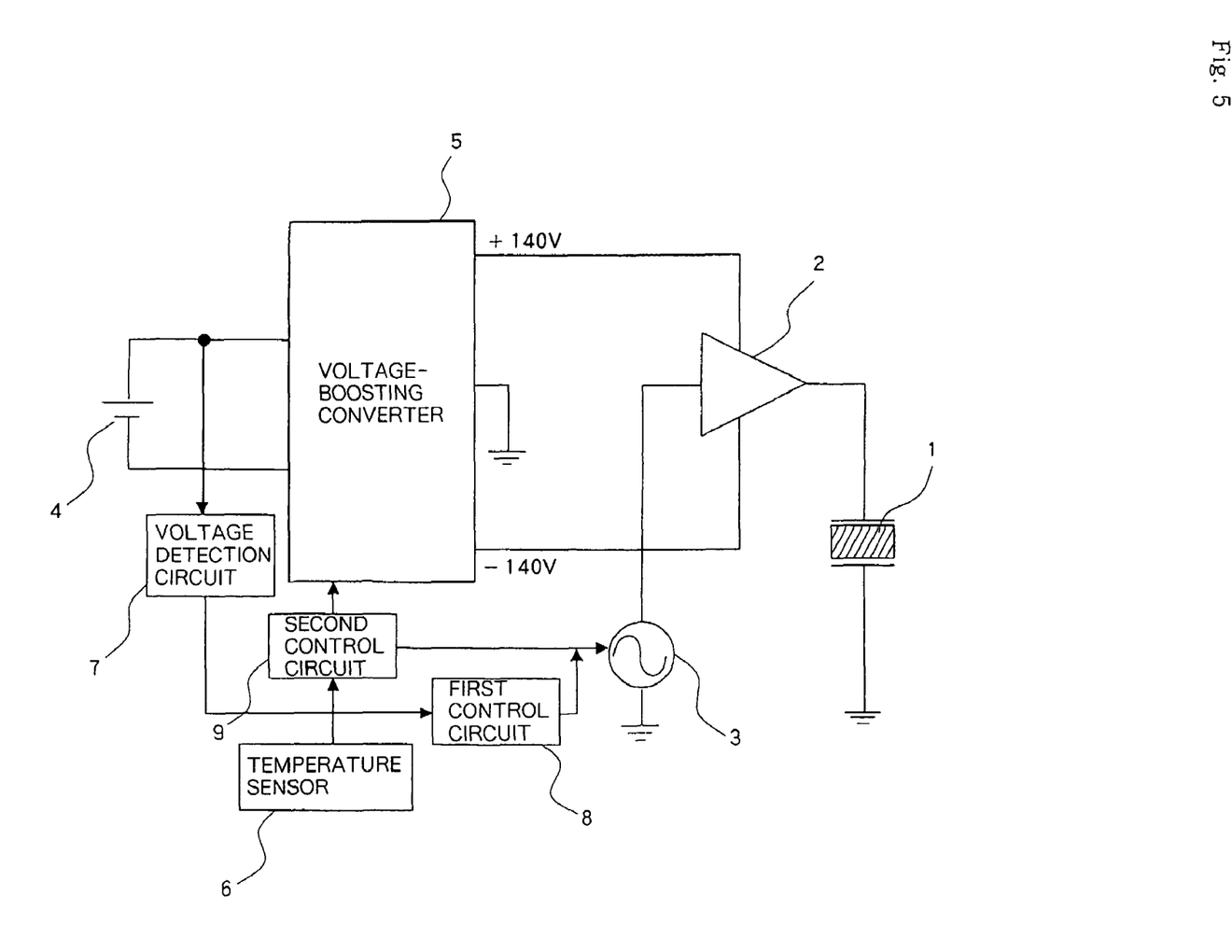
FIG. 5 is a block diagram showing the configuration of an embodiment of the present invention.

FIG. 4 is a block diagram giving a schematic view of the configuration of the first embodiment of the piezoelectric pump drive circuit according to the present invention, and FIG. 5 is a block diagram showing greater detail.

As shown in FIG. 4, the present embodiment is made up from: piezoelectric element 1, amplifier 2, sine wave oscillator 3, power supply 4, voltage-boosting converter 5, temperature sensor 6, voltage detection circuit 7, first control circuit 8, and second control circuit 9.

Piezoelectric element 1 that drives the piezoelectric pump (not shown) is driven by amplifier 2 that takes as input a sine wave signal generated in sine wave oscillator 3. In addition, amplifier 2 is driven at a voltage that is obtained by conversion from low-voltage power supply 4 to high voltage by means of voltage-boosting converter 5. As a result, piezoelectric element 1 is driven by a high-voltage sine wave voltage.

The frequency or amplitude of sine wave oscillator 3 is controlled in accordance with signals from the two control circuits. First control circuit 8 detects the introduction of power supply 4 by means of voltage detection circuit 7 and adjusts the frequency of sine wave oscillator 3 at this time of activation. Second control circuit 9 both adjusts the amplitude of sine wave oscillator 3 in accordance with a signal from temperature sensor 6 that senses the temperature of the heat-generating body and, by adjusting the output voltage of voltage-boosting converter 5, adjusts the drive voltage of piezoelectric element 1 in accordance with the temperature of the heat-generating body.

A block diagram of the piezoelectric pump drive circuit of the first embodiment of the present invention that uses a high-voltage amplifier as amplifier 2 is shown in FIG. 5, and the details of this drive circuit are next described with reference to FIG. 5. Although the basic configuration is the same as in FIG. 4, amplifier 2 requires positive and negative high voltages, and voltage-boosting converter 5 is therefore of a configuration that enables positive and negative voltage output.

The signal supplied as output from sine wave oscillator 3 is applied to amplifier 2, and the amplitude is amplified to the high sine wave voltage that accords with the power-supply voltage of amplifier 2. This sine wave voltage is applied across the electrodes of piezoelectric element 1 to drive piezoelectric element 1. In this case, the power supply of amplifier 2 is a high voltage produced by voltage-boosting converter 5 from low-voltage power supply 4 of, for example, 5V or 12V, that is typically used in electronic equipment. For example, to drive piezoelectric element 1 at an alternating current of 100V, amplifier 2 is driven by ±140V converted to a direct current of 280V (±140V) in voltage-boosting converter 5.

At the time of activation, the introduction of power supply 4 is sensed at voltage detection circuit 7 and reported to first control circuit 8. By means of this notification, the introduction of power is recognized at first control circuit 8, and the frequency of sine wave oscillator 3 is changed to a fixed time interval.

Figure 6:
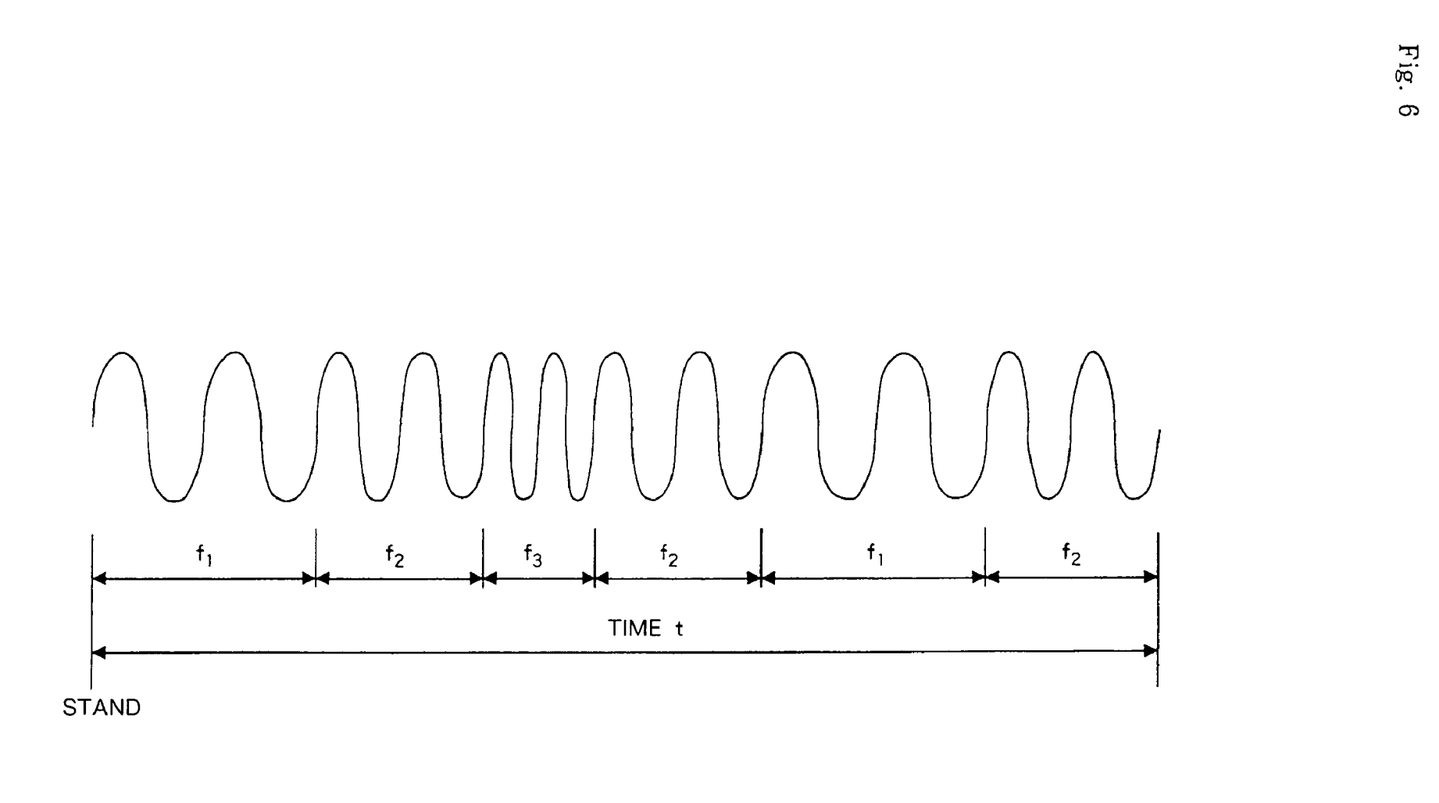
FIG. 6 is a waveform chart for showing the operation of an embodiment of the present invention.

FIG. 6 shows a timing chart of the operation waveforms that are applied to piezoelectric element 1 at the time of activation.

In FIG. 6, at the time of activation of the power supply, piezoelectric element 1 first operates at frequency f1, then operates at frequency f2 that is higher than f1, and then operates at f3 that is higher than f2. Piezoelectric element 1 next operates at frequencies that successively decrease to f2 and f1. The above-described operation continues for an interval of several seconds. When the frequency is varied in this way, any bubbles that have accumulated in the pump chamber during high frequency are dispersed and divided into smaller bubbles by the high-frequency pressure changes in the pump interior. When the pump is next driven at low frequency, the reverse stop valve action in the pump becomes slower, and the finely divided bubbles are discharged from the pump.

Thus, in the above-described embodiment, bubbles that have accumulated inside the pump can be expelled by varying the frequency at the time of activation. The decrease in the pressure applied to the liquid from the pump that results from the absorption of pressure by the bubbles can therefore be eliminated to solve the problem of the inability to circulate liquid due to inadequate pressure, and operation can therefore be reliably started. In the above-described embodiment, a case was described in which the frequency was changed in three steps, but this method will obviously be more effective if the frequency is changed over a greater plurality of steps. In addition, the drive time intervals for each frequency may be equal intervals, or may have time differences for each frequency.

In the present embodiment, moreover, second control circuit 9 is provided for adjusting the output voltage of voltage-boosting converter 5 and the signal amplitude of sine wave oscillator 3 in accordance with a signal produced by temperature sensor 6 that senses the temperature of the heat-generating body. As a result, power consumption can be reduced by decreasing the drive power of the piezoelectric pump when the heat-generating body is not generating heat.

Figure 7:
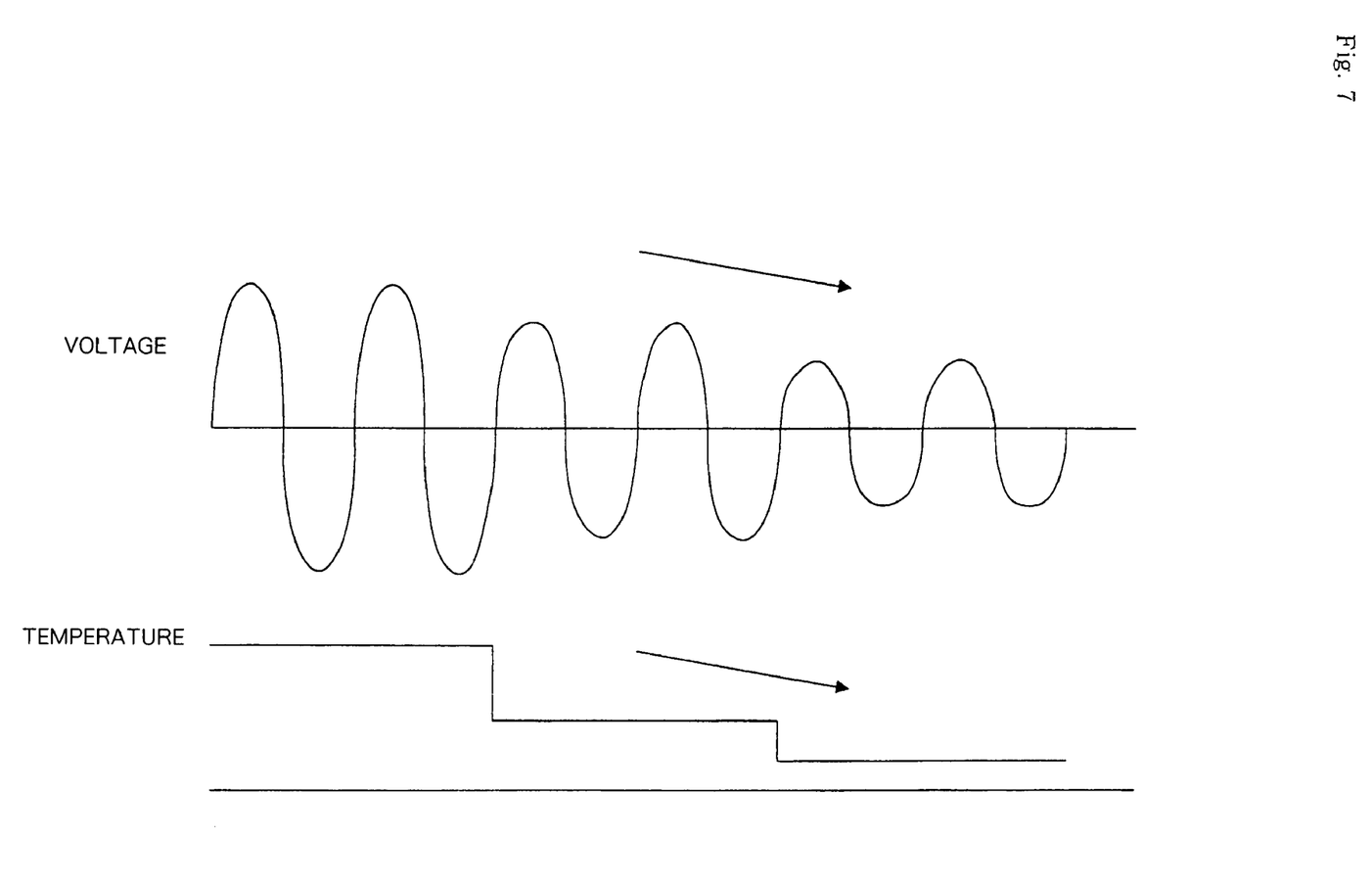
FIG. 7 is a waveform chart for showing an example of an embodiment of the present invention.

FIG. 7 shows the temperature of the heat-generating body and a time chart of the voltage waveforms that are applied to piezoelectric element 1 at the times of these temperatures.

As shown in FIG. 7, second control circuit 9 increases the voltage amplitude that is applied to piezoelectric element 1 when the temperature is high, and decreases the voltage amplitude as the temperature decreases. This control of the voltage amplitude value can be realized in second control circuit 9 by simultaneously changing the output voltage of voltage-boosting converter 5 and the amplitude of sine wave oscillator 3.

Explanation next regards the second embodiment of the present invention.

Figure 8:
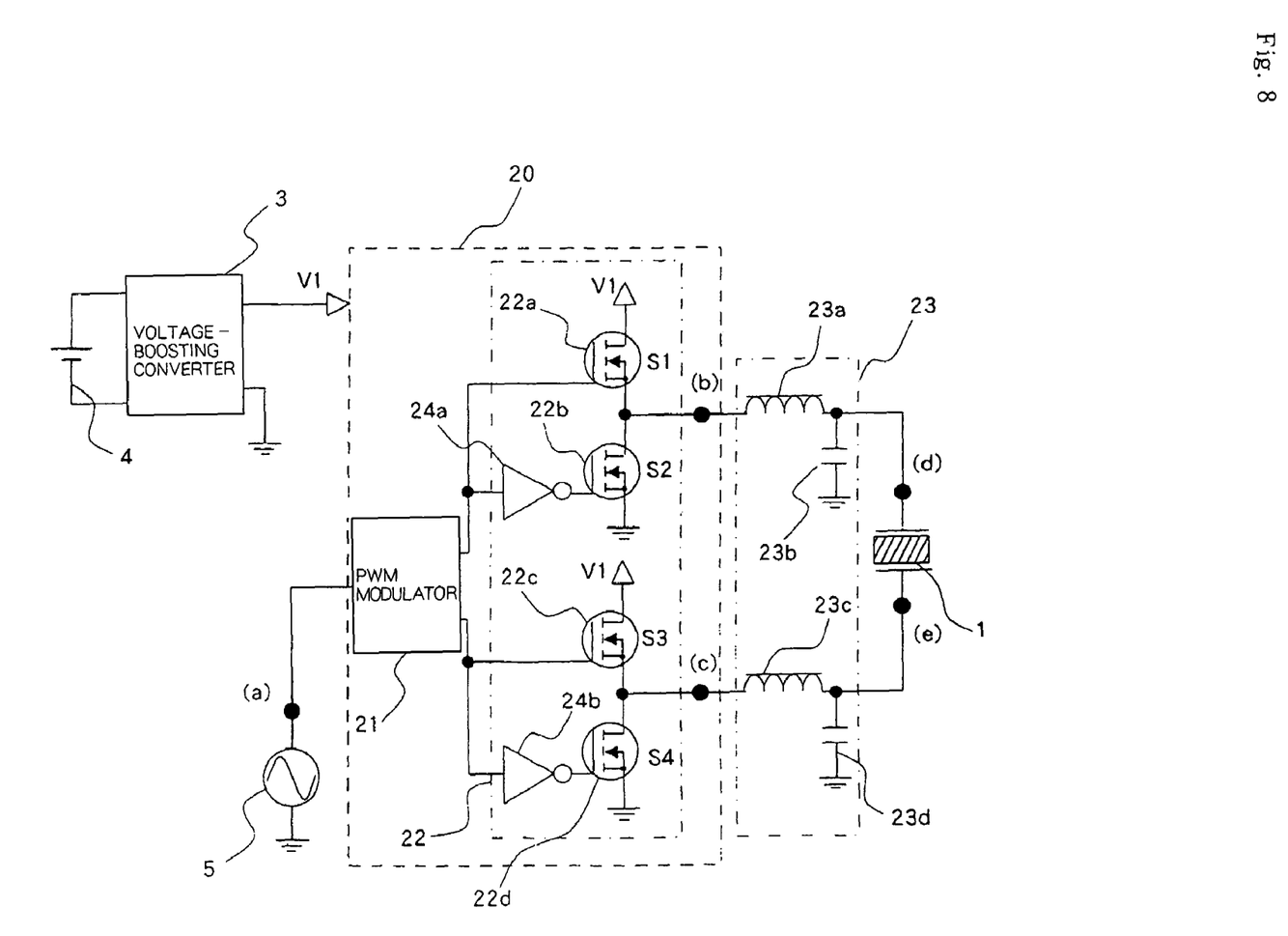
FIG. 8 is a block diagram showing the configuration of an embodiment of the present invention.

The basic configuration of this embodiment is similar to that of the first embodiment, but a D-class amplifier, which is typically employed in audio applications, is used for the amplifier. FIG. 8 shows the configuration.

In FIG. 8: 20 is a D-class amplifier; 21 is a PWM modulator; 22 is an output switch unit; 22a, 22b, 22c, and 22d are a first switch, a second switch, a third switch, and a fourth switch, respectively; 23 is a low-pass filter; 23a is a first inductor; 23b is a first capacitor; 23c is a second inductor; 23d is a second capacitor; 24a is a first inverter circuit; and 24b is a second inverter circuit. In addition, constituent elements that are identical to elements of the first embodiment have been given the same reference numbers, and redundant explanation is therefore here omitted.

In the present embodiment, D-class amplifier 20 is used as amplifier 2. The signal that is supplied as output from sine wave oscillator 3 is compared with a high-frequency triangle wave in PWM modulator 21, and the size relation between the two is supplied as a binary signal square-wave pulse signal. At this time, the output signal from modulator 21 is distributed to two outputs, i.e., the positive and negative sides of the input sine wave signal. By means of this pulse signal, a substantially sine-wave alternating-current voltage having little distortion that has been amplified to a high-voltage pulse signal in switch unit 22, which is made up from first switch 22a, second switch 22b, third switch 22c, and fourth switch 22d, and from which the high-frequency component has been removed in low-pass filter 23 is applied across the electrodes of piezoelectric element 1 to drive piezoelectric element 1.

Figure 9:
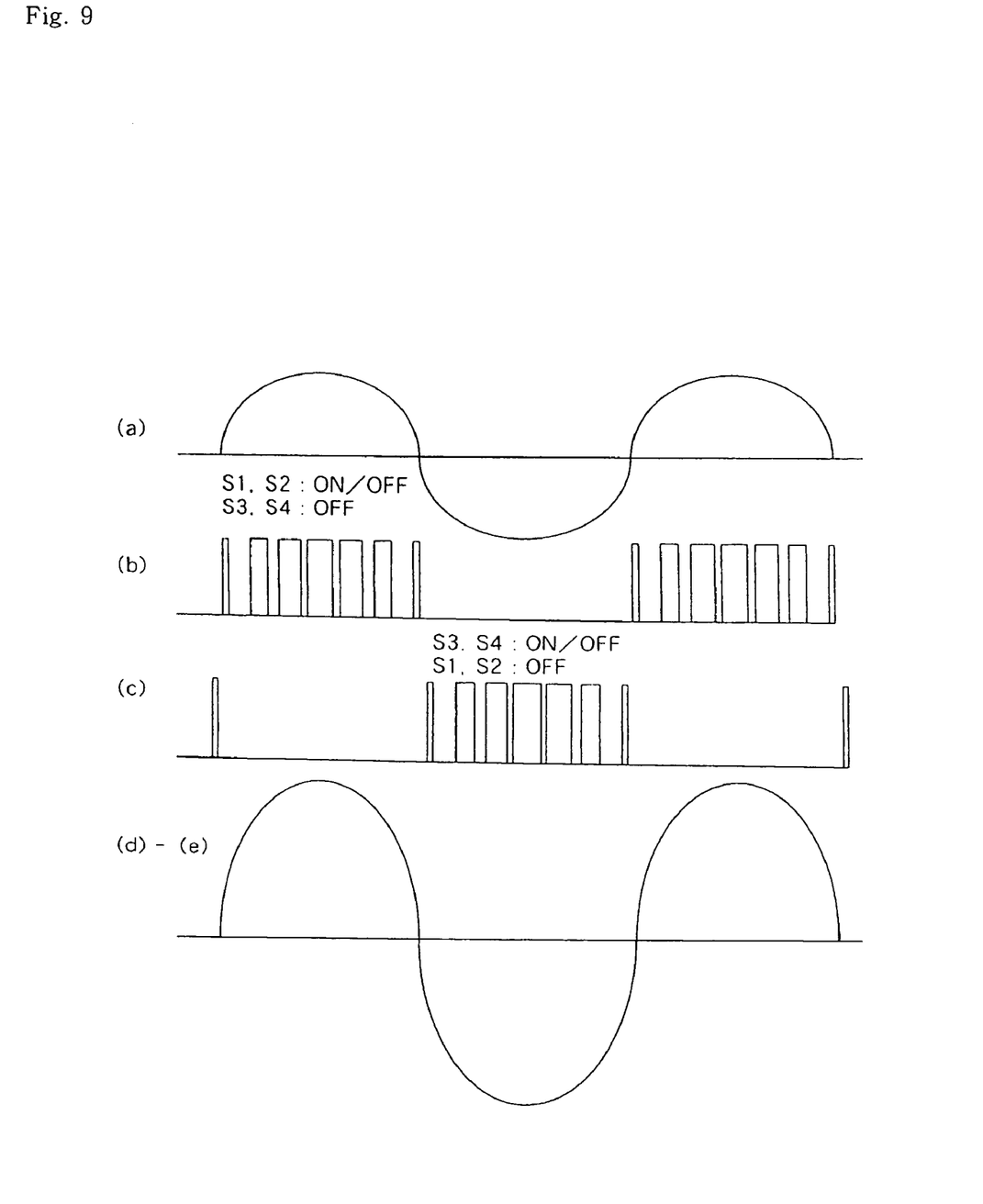
FIG. 9 is a waveform chart for showing the operation of an embodiment of the present invention.

FIG. 9 shows the signal waveforms at points a, b, c, d, and e in FIG. 8 and the signal waveform that is applied to piezoelectric element 1.

The signal at point a is the signal that is generated at sine wave oscillator 3 shown in FIG. 9(a), and has frequency identical to the frequency for driving piezoelectric element 1. The signal at point b is generated as a pulse signal by the repeated alternation between ON and OFF of first switch 22a and second switch 22b with third switch 22c and fourth switch 22d in the OFF state, as shown in FIG. 9(b). The signal at point c is a signal in which phase is shifted 180° with respect to FIG. 9(b) as shown in FIG. 9(c). In this case, third switch 22c and fourth switch 22d repeatedly alternate between ON and OFF with first switch 22a and second switch 22b in the OFF state. A sine wave voltage is applied across the terminals of piezoelectric element 1 by filtering the high-frequency component by low-pass filter 23 as shown in FIGS. 9(d)-(e).

In this case, the differential voltage between FIG. 9(b) and FIG. 9(c) is applied as the voltage across the terminals of piezoelectric element 1, and the output voltage of voltage-boosting converter 5 for supplying D-class amplifier 20 can therefore be limited to a low level. This means that the output voltage of voltage-boosting converter 5 is just one-half that of the first embodiment shown in FIG. 5, whereby components having a lower withstand voltage can be used as the parts of voltage-boosting converter 5, and the parts can be made smaller. For example, to drive piezoelectric element 1 by an alternating current of 100V, the output voltage of voltage-boosting converter 5 can be a direct current of approximately 140V.

Thus, adopting D-class amplifier 20 as amplifier 2 in the present embodiment enables a reduction of the power loss of switch unit 22, enables operation with low power consumption, and further, allows limitation of the output voltage of voltage-boosting converter 5, and therefore obtains the effect of enabling miniaturization of components.

As described in the foregoing explanation, the piezoelectric pump drive circuit of the present invention is used in the cooling system of, for example, electronic equipment; and the present invention includes a cooling system having: a piezoelectric pump drive circuit shown in each of the above-described embodiments; a heat sink that contacts a heat-generating body; a radiator that radiates heat to the outside; coolant circulation passages that are connected such that coolant circulates between the heat sink and radiator; and a piezoelectric pump that is driven by the piezoelectric pump drive circuit for circulating coolant in the coolant circulation passages.

As an application of the present invention, the present invention can be used in a piezoelectric pump drive circuit that is used as the cooling device of mobile equipment such as a notebook computer.

What is claimed is:

1. A piezoelectric pump drive circuit comprising:
   a sine wave oscillation means for generating a sine wave signal of the frequency that drives a piezoelectric element of a piezoelectric pump;
   a voltage-boosting means for converting a low-voltage supplied by one of a 5VDC power supply and a 12VDC power supply to a high voltage of one of approximately 140VDC and approximately 280VDC; and
   an amplification means driven by the high voltage generated by said voltage-boosting means for amplifying the signal supplied as output from said sine wave oscillation means and for driving said piezoelectric element by a high-voltage sine wave;
   wherein said amplification means is composed of: a D-class amplifier driven by a high voltage generated by said voltage-boosting means for subjecting the signal supplied as output from said sine wave oscillation means to pulse-width modulation to realize amplification; and a low-pass filter for demodulating the output signal of said D-class amplifier.

2. A piezoelectric pump drive circuit comprising:
   a sine wave oscillation means for generating a sine wave signal of the frequency that drives a piezoelectric element of a piezoelectric pump;
   a voltage-boosting means for converting a low-voltage power supply to a high voltage;
   an amplification means driven by high voltage generated by said voltage-boosting means for amplifying the signal supplied as output from said sine wave oscillation means and for driving said piezoelectric element by a high-voltage sine wave;
   a power supply which supplies voltage to the sine wave oscillation means to activate the sine wave oscillation means;
   control means for implementing variable frequency control over three or more different frequencies at the time of activation of said sine wave oscillation means; and
   a voltage detection circuit which detects when the voltage to the sine wave oscillation means is supplied at power up and provides a signal to the control means indicative of a detection of voltage.

3. The piezoelectric pump drive circuit according to claim 2, wherein the control means implements the variable frequency control over three or more different frequencies at the time of activation of the sine wave oscillation means based on the provided signal.

4. The piezoelectric pump drive circuit according to claim 3, further comprising:
   a temperature sensing means for sensing temperature of a heat generating body, which is different from the piezoelectric element; and
   another control means for adjusting signal amplitude of the sine wave oscillation means based on the sensed temperature.

5. The piezoelectric pump drive circuit according to claim 2, wherein the voltage-boosting means converts the low-voltage power supply to the high voltage of one of approximately 140VDC and approximately 280VDC.

6. A piezoelectric pump drive circuit comprising:

a sine wave oscillation means for generating a sine wave signal of the frequency that drives a piezoelectric element of a piezoelectric pump;

a voltage-boosting means for converting a low-voltage power supply to a high voltage;

an amplification means composed of a D-class amplifier driven by high voltage generated by said voltage-boosting means for subjecting a signal supplied as output from said sine wave oscillation means to pulse-width modulation to realize amplification, and a low-pass filter for demodulating the output signal of said D-class amplifier; said amplification means being driven at high voltage generated by said voltage-boosting means and amplifying the signal supplied as output from said sine wave oscillation means for driving said piezoelectric element by a high-voltage sine wave;

a power supply which supplies voltage to the sine wave oscillation means to activate the sine wave oscillation means;

a control means for implementing variable frequency control over three or more different frequencies at the time of activation of said sine wave oscillation means; and a voltage detection circuit which detects when the voltage to the sine wave oscillation means is supplied at power up and provides a signal to the control means indicative of a detection of voltage.

7. A piezoelectric pump drive circuit comprising:

a sine wave oscillation means for generating a sine wave signal of the frequency that drives a piezoelectric element of a piezoelectric pump;

a voltage-boosting means for converting a low-voltage power supply to a high voltage;

an amplification means composed of a D-class amplifier driven by high voltage generated by said voltage-boosting means for subjecting a signal supplied as output from said sine wave oscillation means to pulse-width modulation to realize amplification, and low-pass filter for demodulating the output signal of said D-class amplifier; said amplification means being driven at high voltage generated by said voltage-boosting means and amplifying the signal supplied as output from said sine wave oscillation means for driving said piezoelectric element by a high-voltage sine wave;

a temperature sensing means for sensing temperature of a heat-generating body; and a control means for one of increasing the signal amplitude of said sine wave oscillation means when the temperature of the heat-generating body is increased and decreasing the signal amplitude of the sine wave oscillation means when the temperature of said heat-generating body is decreased, based on the sensed temperature.

8. A piezoelectric pump drive circuit comprising:

a sine wave oscillation means for generating a sine wave signal of the frequency that drives a piezoelectric element of a piezoelectric pump;

a voltage-boosting means for converting a low-voltage power supply to a high voltage;

an amplification means driven by high voltage generated by said voltage-boosting means for amplifying the signal supplied as output from said sine wave oscillation means and for driving said piezoelectric element by a high-voltage sine wave;

a temperature sensing means for sensing temperature of a heat-generating body; and a control means for one of increasing the signal amplitude of said sine wave oscillation means when the temperature of the heat-generating body is increased and decreasing the signal amplitude of said sine wave oscillation means when the temperature of said heat-generating body is decreased, based on the sensed temperature;

wherein said amplification means is composed of: a D-class amplifier driven by a high voltage generated by said voltage-boosting means for subjecting the signal supplied as output from said sine wave oscillation means to pulse-width modulation to realize amplification; and a low-pass filter for demodulating the output signal of said D-class amplifier.

9. A piezoelectric pump drive circuit comprising:

a sine wave oscillation means for generating a sine wave signal of the frequency that drives a piezoelectric element of a piezoelectric pump;

a voltage-boosting means for converting a low-voltage power supply to a high voltage;

an amplification means driven by high voltage generated by said voltage-boosting means for amplifying the signal supplied as output from said sine wave oscillation means and for driving said piezoelectric element by a high-voltage sine wave;

a power supply which supplies voltage to the sine wave oscillation means to activate the sine wave oscillation means:

a first control means for implementing variable frequency control at the time of activation of said sine wave oscillation means;

a voltage detection circuit which detects when the voltage to the sine wave oscillation means is supplied at power up and provides a signal to the first control means indicative of a detection of voltage;

a temperature sensing means for sensing temperature; and a second control means for adjusting the signal amplitude of said sine wave oscillation means in accordance with the sensed temperature of said temperature sensing means.

10. A piezoelectric pump drive circuit comprising:

a sine wave oscillation means for generating a sine wave signal of the frequency that drives a piezoelectric element of a piezoelectric pump;

a voltage-boosting means for converting a low-voltage power supply to a high voltage;

an amplification means driven by high voltage generated by said voltage-boosting means for amplifying the signal supplied as output from said sine wave oscillation means and for driving said piezoelectric element by a high-voltage sine wave;

a power supply which supplies voltage to the sine wave oscillation means to activate the sine wave oscillation means;

a first control means for implementing variable frequency control at the time of activation of said sine wave oscillation means;

a voltage detection circuit which detects when the voltage to the sine wave oscillation means is supplied at power up and provides a signal to the first control means indicative of a detection of voltage;

a temperature sensing means for sensing temperature; and a second control means for adjusting the signal amplitude of said sine wave oscillation means in accordance with the sensed temperature of said temperature sensing means;

wherein said amplification means is composed of: a D-class amplifier driven by a high voltage generated by said voltage-boosting means for subjecting the signal supplied as output from said sine wave oscillation means to pulse-width modulation to realize amplification; and a low-pass filter for demodulating the output signal of said D-class amplifier.

11. A cooling system comprising:
a piezoelectric pump drive circuit comprising:
  a sine wave oscillation means for generating a sine wave signal of the frequency that drives a piezoelectric element of a piezoelectric pump;
  a voltage-boosting means for converting a low-voltage supplied by one of a 5VDC power supply and a 12VDC power supply to a high voltage of one of approximately 140VDC and approximately 280VDC; and
  an amplification means driven by high voltage generated by said voltage-boosting means for amplifying the signal supplied as output from said sine wave oscillation means and for driving said piezoelectric element by a high-voltage sine wave;
wherein said amplification means is composed of: a D-class amplifier driven by a high voltage generated by said voltage-boosting means for subjecting the signal supplied as output from said sine wave oscillation means to pulse-width modulation to realize amplification; and a low-pass filter for demodulating the output signal of said D-class amplifier;
  a heat sink that contacts a heat-generating body;
  a radiator for radiating heat to the outside;
coolant circulation passages connected such that coolant circulates between said heat sink and said radiator; and
  a piezoelectric pump that is driven by said piezoelectric pump drive circuit for circulating coolant in said coolant circulation passages.

12. A cooling system comprising:
a piezoelectric pump drive circuit comprising:
  a sine wave oscillation means for generating a sine wave signal of the frequency that drives a piezoelectric element of a piezoelectric pump;
  a voltage-boosting means for converting a low-voltage power supply to a high voltage;
  an amplification means driven by high voltage generated by said voltage-boosting means for amplifying the signal supplied as output from said sine wave oscillation means and for driving said piezoelectric element by a high-voltage sine wave;
  a power supply which supplies voltage to the sine wave oscillation means to activate the sine wave oscillation means;
  control means for implementing variable frequency control over three or more different frequencies at the time of activation of said sine wave oscillation means; and
  a voltage detection circuit which detects when the voltage to the sine wave oscillation means is supplied at power up and provides a signal to the control means indicative of a detection of voltage;
  a heat sink that contacts a heat-generating body;
a radiator for radiating heat to the outside;
coolant circulation passages connected such that coolant circulates between said heat sink and said radiator;
  a piezoelectric pump that is driven by said piezoelectric pump drive circuit for circulating coolant in said coolant circulation passages.

13. A cooling system comprising:
a piezoelectric pump drive circuit comprising:
  a sine wave oscillation means for generating a sine wave signal of the frequency that drives a piezoelectric element of a piezoelectric pump;
  a voltage-boosting means for converting a low-voltage power supply to a high voltage;
  an amplification means driven by high voltage generated by said voltage-boosting means for amplifying the signal supplied as output from said sine wave oscillation means and for driving said piezoelectric element by a high-voltage sine wave;
  a power supply which supplies voltage to the sine wave oscillation means to activate the sine wave oscillation means;
  a control means for implementing variable frequency control at the time of activation of said sine wave oscillation means; and
  a voltage detection circuit which detects when the voltage to the sine wave oscillation means is supplied at power up and provides a signal to the control means indicative of a detection of voltage;
wherein said amplification means is composed of: a D-class amplifier driven by a high voltage generated by said voltage-boosting means for subjecting the signal supplied as output from said sine wave oscillation means to pulse-width modulation to realize amplification; and a low-pass filter for demodulating the output signal of said D-class amplifier;
  a heat sink that contacts a heat-generating body;
  a radiator for radiating heat to the outside;
coolant circulation passages connected such that coolant circulates between said heat sink and said radiator; and
  a piezoelectric pump that is driven by said piezoelectric pump drive circuit for circulating coolant in said coolant circulation passages.

14. A cooling system comprising:
a piezoelectric pump drive circuit comprising:
  a sine wave oscillation means for generating a sine wave signal of the frequency that drives a piezoelectric element of a piezoelectric pump;
  a voltage-boosting means for converting a low-voltage power supply to a high voltage;
  an amplification means driven by high voltage generated by said voltage-boosting means for amplifying the signal supplied as output from said sine wave oscillation means and for driving said piezoelectric element by a high-voltage sine wave;
  a temperature sensing means for sensing temperature of a heat-generating body; and
  a control means for one increasing the signal amplitude of said sine wave oscillation means when the temperature of the heat-generating body is increased and decreasing the signal amplitude of the sine wave oscillation means when the temperature of said heat-generating body is decreased, based on the sensed temperature;
a heat sink that contacts the heat-generating body;
a radiator for radiating heat to the outside;
coolant circulation passages connected such that coolant circulates between said heat sink and said radiator; and
a piezoelectric pump that is driven by said piezoelectric pump drive circuit for circulating coolant in said coolant circulation passages.

15. A cooling system comprising:
a piezoelectric pump drive circuit comprising:
- a sine wave oscillation means for generating a sine wave signal of the frequency that drives a piezoelectric element of a piezoelectric pump;
- a voltage-boosting means for converting a low-voltage power supply to a high voltage;
- an amplification means driven by high voltage generated by said voltage-boosting means for amplifying the signal supplied as output from said sine wave oscillation means and for driving said piezoelectric element by a high-voltage sine wave;
- a temperature sensing means for sensing temperature of a heat-generating body; and
- a control means for one of increasing the signal amplitude of said sine wave oscillation means when the temperature of said heat-generating body is increased and decreasing the signal amplitude of said sine wave oscillation means when the temperature of said heat-generating body is decreased, based on the sensed temperature;

wherein said amplification means is composed of: a D-class amplifier driven by a high voltage generated by said voltage-boosting means for subjecting the signal supplied as output from said sine wave oscillation means to pulse-width modulation to realize amplification; and a low-pass filter for demodulating the output signal of said D-class amplifier;
a heat sink that contacts the heat-generating body;
a radiator for radiating heat to the outside;
coolant circulation passages connected such that coolant circulates between said heat sink and said radiator; and
- a piezoelectric pump that is driven by said piezoelectric pump drive circuit for circulating coolant in said coolant circulation passages.

16. A cooling system comprising:
a piezoelectric pump drive circuit comprising:
- a sine wave oscillation means for generating a sine wave signal of the frequency that drives a piezoelectric element of a piezoelectric pump;
- a voltage-boosting means for converting a low-voltage power supply to a high voltage;
- an amplification means driven by high voltage generated by said voltage-boosting means for amplifying the signal supplied as output from said sine wave oscillation means and for driving said piezoelectric element by a high-voltage sine wave;
- a power supply which supplies voltage to the sine wave oscillation means to activate the sine wave oscillation means;
- a first control means for implementing variable frequency control at the time of activation of said sine wave oscillation means;
- a voltage detection circuit which detects when the voltage to the sine wave oscillation means is supplied at power up and provides a signal to the first control means indicative of a detection of voltage;
- a temperature sensing means for sensing temperature; and
- a second control means for adjusting the signal amplitude of said sine wave oscillation means in accordance with the sensed temperature of said temperature sensing means;
a heat sink that contacts a heat-generating body;
a radiator for radiating heat to the outside;
coolant circulation passages connected such that coolant circulates between said heat sink and said radiator; and
- a piezoelectric pump that is driven by said piezoelectric pump drive circuit for circulating coolant in said coolant circulation passages.

17. A cooling system comprising:
a piezoelectric pump drive circuit comprising:
- a sine wave oscillation means for generating a sine wave signal of the frequency that drives a piezoelectric element of a piezoelectric pump;
- a voltage-boosting means for converting a low-voltage power supply to a high voltage;
- an amplification means driven by high voltage generated by said voltage-boosting means for amplifying the signal supplied as output from said sine wave oscillation means and for driving said piezoelectric element by a high-voltage sine wave;
- a power supply which supplies voltage to the sine wave oscillation means to activate the sine wave oscillation means;
- a first control means for implementing variable frequency control at the time of activation of said sine wave oscillation means;
- a voltage detection circuit which detects when the voltage to the sine wave oscillation means is supplied at power up and provides a signal to the first control means indicative of a detection of voltage;
- a temperature sensing means for sensing temperature; and
- a second control means for adjusting the signal amplitude of said sine wave oscillation means in accordance with the sensed temperature of said temperature sensing means;

wherein said amplification means is composed of: a D-class amplifier driven by a high voltage generated by said voltage-boosting means for subjecting the signal supplied as output from said sine wave oscillation means to pulse-width modulation to realize amplification; and a low-pass filter for demodulating the output signal of said D-class amplifier;
a heat sink that contacts a heat-generating body;
a radiator for radiating heat to the outside;
coolant circulation passages connected such that coolant circulates between said heat sink and said radiator; and
- a piezoelectric pump that is driven by said piezoelectric pump drive circuit for circulating coolant in said coolant circulation passages.

* * * * *